United States Patent [19]
Rao

[11] Patent Number: 5,896,493
[45] Date of Patent: Apr. 20, 1999

[54] RAID ALGORITHM USING A MULTIMEDIA FUNCTIONAL UNIT

[75] Inventor: Anil V. Rao, Austin, Tex.

[73] Assignee: Dell USA, L.P., Round Rock, Tex.

[21] Appl. No.: 08/785,374

[22] Filed: Jan. 17, 1997

[51] Int. Cl.⁶ .................................................... H03M 13/00
[52] U.S. Cl. ................................ 395/182.04; 371/40.2
[58] Field of Search ........................... 371/40.11, 40.2, 371/40.3, 40.4, 40.13; 395/182.03, 182.04; 711/114

[56] References Cited

U.S. PATENT DOCUMENTS

| | | | |
|---|---|---|---|
| 5,398,253 | 3/1995 | Gordon | 371/40.4 |
| 5,506,977 | 4/1996 | Jones | 395/482 |
| 5,533,190 | 7/1996 | Binford et al. | 395/182.04 |
| 5,623,595 | 4/1997 | Bailey | 395/182.04 |

OTHER PUBLICATIONS

Mike Miller "XOR Commands on SCSI Disk Drives" pp. 1–30, No date ANSI Standard X3T10/94–111r9.
Intel, "Introduction to the Intel® Pentium Pro Processor", pp. 2–8, 2–10 thru 2–11.
Michael Slater, "Cyrix Doubles 6×86 Performance with M2", Oct. 28, 1996, pp. 23–25.
Tom R. Halfhill, "The x86 Gets Faster with Age", Nov. 1996, pp. 89–98.
Linley Gwennap, "Intel's MMX Speeds Multimedia", vol. 10, No. 3, Mar. 5, 1996, pp. 1, 5–10.
Michael Slater, "Intel's Long–Awaited P55C Disclosed", Oct. 28, 1996, pp. 20–22.
Intel Corporation, Programmer's Referece Manual, "Intel Architecture MMX Technology", Mar. 1996, Chapters 1–5, Appendix A–D.

Primary Examiner—Albert Decady
Attorney, Agent, or Firm—Skjerven, Morrill, MacPherson, Franklin & Friel, L.L.P.; Stephen A. Terrile; David G. Dolezal

[57] ABSTRACT

A computer system using a processor with a multimedia functional unit capable of executing an Exclusive OR(XOR) type instruction for performing the RAID functions of storing and recovering bits on an array of disk drives. Blocks of data stored on different disk drives of the array are XORed together by the multimedia functional unit of a processor to form a parity block stored on a parity disk drive of the array. If one of the blocks is lost, the data can be recovered by the multimedia functional unit performing XOR instructions on the remaining data blocks and the parity block.

32 Claims, 6 Drawing Sheets

RAID ALGORITHM USING A MULTIMEDIA FUNCTIONAL UNIT

BACKGROUND OF THE INVENTION

1. Field of the Invention

The present invention relates to computer systems, and more particularly, to computer systems employing Redundant Array of Inexpensive Disks (RAID) systems.

2. Description of the Related Art

Computer systems in general and International Business Machines (IBM) compatible personal computer systems in particular have attained widespread use for providing computer power to many segments of today's modem society. A personal computer system can usually be defined as a desk top, floor standing, or portable microcomputer that includes a system unit having a system processor and associated volatile and non-volatile memory, a display monitor, a keyboard, one or more diskette drives, a fixed disk storage device, and an optional printer. One of the distinguishing characteristics of these systems is the use of a system board to electrically connect these components together. These personal computer systems are information handling systems which are designed primarily to give independent computing power to a single user (or a relatively small group of users in the case of personal computers which serve as computer server systems) and are inexpensively priced for purchase by individuals or small businesses. A personal computer system may also include one or a plurality of I/O devices (i.e. peripheral devices) which are coupled to the system processor and which perform specialized functions. Examples of I/O devices include modems, sound and video devices or specialized communication devices. Mass storage devices such as disk drive systems which include hard disks drives, CD-ROM drives or magneto-optical drives are also considered to be peripheral devices.

Other types of computer systems include network servers which provide shared storage to a network of computer users.

Today's computer systems face an ever increasing need for more data storage capacity. For some computer systems, such as network servers, this need has long outgrown the capacity of a single disk drive. Multiple disk drive systems have been developed to increase the storage capacity of these systems. One problem of using a multiple disk drive system is how to configure the multiple disk drive system to appear as a single storage entity to several users on a network and still provide high speed and reliable data accessing.

One solution for increased memory capacity is to link the multiple disk drives to make a disk drive array. One method, called Redundant Array of Inexpensive Disks (RAID), combines a number of individual disk drives to provide a massive, virtual data storage system. In a RAID system, a controller allocates information between drives to make the drives appear as a single logical drive to a computer system. In addition to increasing storage capacity, a RAID can also be used to increase reliability by providing redundant storage of data blocks on more than one disk drive in the array. Thus, if one disk drive fails, the information stored on that drive can be obtained from other drives storing the same information.

With a RAID system, data may be split among the drives at the bit, byte, or block level. For, example, in a four-drive system, one byte of a four byte block could be stored on the first drive, the next byte on the second drive, and so on. Accordingly, the four drives could provide the four byte block to the data stream four times faster than one drive providing four bytes consecutively. This technique of splitting data between various drives is called data striping.

A RAID system can also be configured to provide redundancy in case one drive fails. This can be accomplished by adding another disk drive to contain a parity byte. In the event that one of the drives fails, the byte lost from the failed drive can be reconstructed with the use of the parity byte stored on the parity disk drive. To form the parity byte, a byte from each disk drive is XORed together. The XOR instruction is also used to recover the bytes from the lost disk drive. If the third disk drive is lost, the remaining bytes are XORed with the parity byte to obtain the lost byte. Thus, the XOR instruction is used to perform the RAID functions of forming a parity block of data and recovering a lost block of data.

The XOR instruction is used in various RAID schemes. One RAID scheme is disclosed in Jones, U.S. Pat. No. 5,506,977.

Currently, the XOR function in RAID programs such as the Windows-NT software RAID and the Dell Small Computer System Interface (SCSI) Array is performed by the integer unit of processors conforming to the X86 architecture or to a RISC architecture. Because these RAID -functions require several XOR instructions, the RAID algorithms require a lot of processor time. What is needed is a method to utilize the processor in a more efficient manner by reducing the number of XOR instructions required, and therefore, improve the speed of the RAID functions.

It is known to provide a processor conforming to the X86 architecture with a multimedia function unit. For example, the processor available under the trade designation Pentium from Intel Corporation has incorporated a multimedia functional unit that is referred to as the MMX functional unit. This processor and multimedia technology is described in the "Intel Architecture MMX(TM)Techlology, Programmer's Reference Manual," March 1996, and the "Intel MMX(TM) Technology, Developer's Guide" which are hereby incorporated by reference in their entirety.

SUMMARY OF THE INVENTION

Using the multimedia function unit of a processor to perform XOR instructions for Redundant Array of Inexpensive Disks (RAID) functions advantageously frees up the integer unit of the processor, and thereby more efficiently utilizes the processor. In addition, the multimedia functional unit allows for an increased amount of data to be XORed with a single XOR instruction, thereby speeding up the RAID data striping and data recovery functions in a computer system.

More specifically, in one aspect of the invention, a method for storing and recovering bits on an array of disk drives includes providing a processor with a multimedia functional unit capable of executing an Exclusive OR(XOR) type instruction and performing an XOR type instruction in the multimedia functional unit of the processor on the first group of bits originating from a memory with a second group of bits to obtain a first group of XORed bits in order to perform a RAID function.

In another aspect of the invention, a computer system includes a processor with a multimedia functional unit and a memory coupled to the processor. The memory stores a plurality of blocks of data. Each block includes at least one group of bits. The computer system also includes an array of disk drives coupled to the processor. The processor sends and receives data to and from each disk drive. Each disk drive receives and stores at least one block of data from the memory. The computer system also includes a non-volatile memory coupled to the processor. The non-volatile memory includes means for forming a first block of data using the multimedia functional unit to perform an exclusive OR (XOR) type instruction on at least one group of bits from a second block of data with at least one group of bits from a third block of data. The non-volatile memory also includes means for storing the first block of data on a first disk drive of the array, the second block of data on a second disk drive of the array, and the third block of data on a third disk drive of the array.

BRIEF DESCRIPTION OF THE DRAWINGS

The present invention may be better understood, and its numerous objects, features, and advantages made apparent to those skilled in the art by referencing the accompanying drawings.

DESCRIPTION OF THE PREFERRED EMBODIMENT(S)

The following sets forth a detailed description of the best contemplated mode for carrying out the invention. The description is intended to be illustrative of the invention and should not be taken to be limiting.

Figure 1:
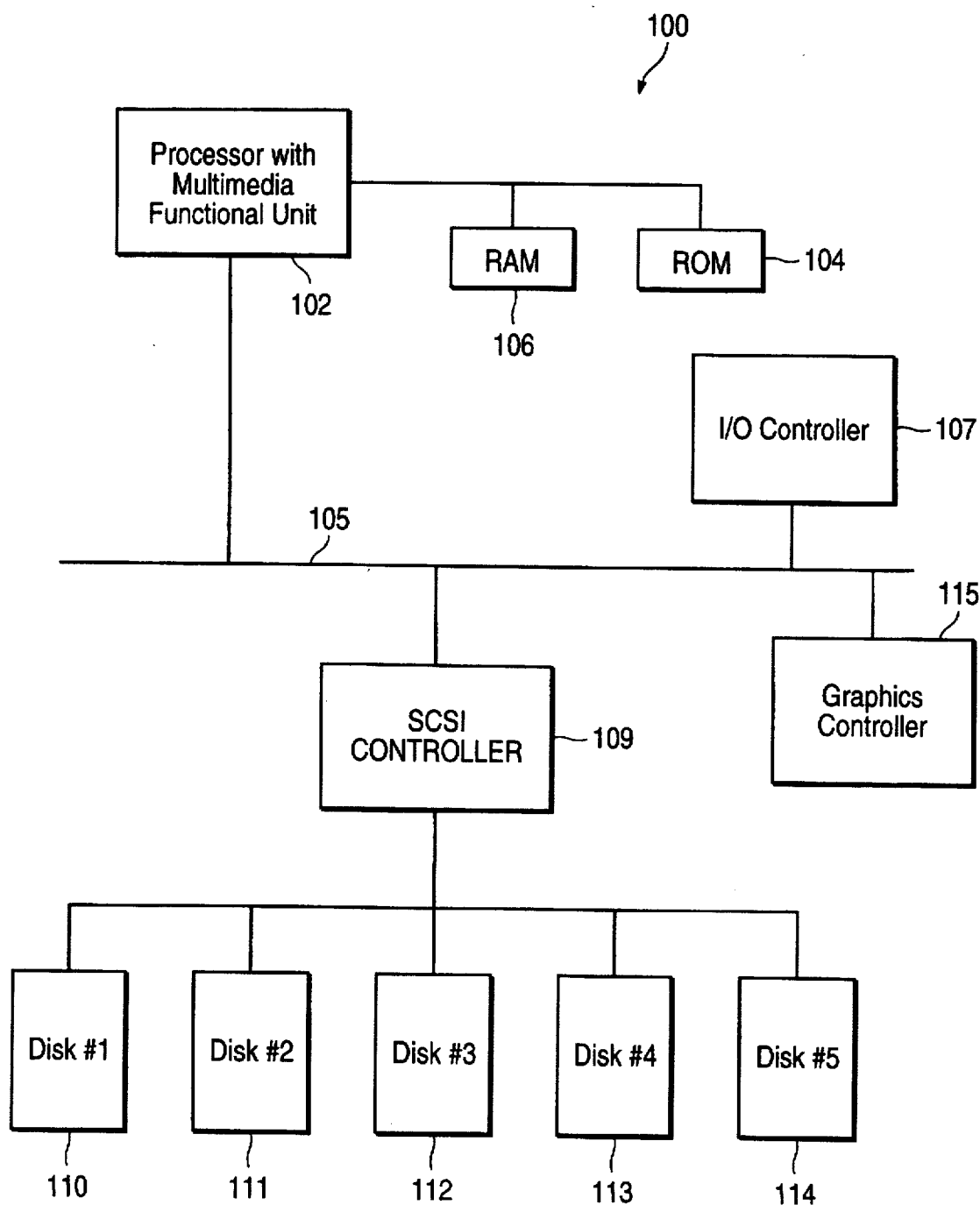
FIG. 1 shows a block diagram of a computer system utilizing the present invention.

FIG. 1 is a functional block circuit diagram of a computer system 100 including an array of five hard disk drives 110–114 employing the present invention. The number of disk drives in the array may be varied. In other embodiments, other types of disk drives may be used such as CD-ROM drives or magneto-optical drives. Computer system 100 includes a main processor CPU 102 with a multimedia functional unit (201 on FIG. 2). Processor 102 is connected to a RAM Memory 106 and ROM memory 104. The processor is coupled to a bus 105 in which it sends and receives data to and from various other devices on the bus such as an I/O controller 107, a graphics controller 115, and a small computer systems interface (SCSI) controller 109. The SCSI controller 109 controls all reads and writes to the array of disk drives 110–114 and performs the SCSI functions. En other embodiments, controllers operating under standards such as the Intelligent Drive Electronics (IDE) standard or the I.E.E.E. 1394 standard may be used instead of the SCSI controller 109. ROM 104 is a non-volatile memory that contains the firmware for the computer system. The operation of computer system 100 is controlled by an operating system such as the Windows NT operating system or the Novell Netware operating system. However, in other embodiments, the operating system may conform to other types of operating system architectures.

Each of the disk drives 110–114 is somewhat intelligent, such as having a SCSI interface, plus an on-board data separator, buffer, and disk controller (all not shown).

Each disk drive holds, for example, 1 GB of formatted data so that the array functions as a single 4 GB memory. The disk drives store the data in 512 byte (½ KB) sectors.

The processor 102 communicates to each of the disk drives 110–114 via the SCSI controller 109. With redundant storage across the disk drives, computer system 100, including the disk drives 100–114, forms a RAID. The storage capacity decreases due to the redundancy aspect of RAID.

Processor 102 generates access requests for each of the individual disk drives 110–114 via the SCSI controller 109. SCSI controller 109 sends logical commands to a disk drive, and the individual disk drive's controller does the actual generation of pulses to move the read/write head.

Processor 102 writes data to the disk drives 110–114 with data striping and parity. Each 2 KB of data is split into four ½ KB portions or blocks which are written to four corresponding sectors on disk drives 110–114 (e.g., four of the five sectors). The fifth corresponding sector is written with a block of data formed with the exclusive OR (XOR) (bitwise parity) of the data on the other four sectors. Thus, if any one of the disk drives 110–114 fails or develops a defect in its one of the sectors, the data can be reconstructed from the data in the other four sectors by processor 102.

This constitutes the RAID aspect of the computer system 100 with the disk drives 110–114. The data reconstruction permits continued operation even with a failed disk drive. Once a failed disk drive has been replaced, reconstruction of the data for writing onto the replacement disk drive can be performed in background without any down time. Of course, each sector will have its own CRC (cyclic redundancy code) or ECC (error correction code) bytes to check for errors in the 512 bytes of data in the sector. This error checking is in addition to the redundancy of the parity sector. Furthermore, contiguous data could be written into stripes using every other sector on a track (2-to-1 interleaving). The time during which an intervening sector passes under the head can be used for loading/unloading the track buffer and for error checking of the data just read from a sector.

As each block of data is being written to the data drives 110–114 in the array, microcode generates an XOR instruction across the blocks of data to be stored. The parity data formed are all combined into one parity block and written onto the parity drive. In some RAID systems such as those conforming to a RAID 3 standard, all of the parity blocks are written to a single disk drive. With other RAID standards such as RAID 5, different parity blocks are written to different disks in the array so that the parity blocks are scattered among all of the disk drives.

The parity block is formed from the XORing of the other blocks of data. The formation of the parity block depends on the number of data drives in the array. The parity block is generated by:

parity data$_{fourdrives}$=dataA⊕dataB⊕dataC⊕dataD
parity data$_{threedrives}$=dataA⊕dataB⊕dataC
parity data$_{twodrives}$=dataA⊕dataB Where dataA is stored on drive 10, dataB is stored on drive 111, dataC is stored on drive 112 (if existing), and dataD is stored on drive 113 (if existing).

The parity block is loaded onto the parity drive as soon as possible after the writes to the data drives. The performance overhead is simply the time required to generate the XOR of the data, and the time to send the write data to the parity drive. In the case of a write of a number of sectors which does not divide evenly into the number of data drives, there is an additional overhead to read the other sectors in the same stripe, to perform a read modify write cycle to get the parity block correct. This is not a major concern as the majority of disk operations are reads.

The processor 102 can continue responding to system requests after a drive fails (providing the failure is not catastrophic enough to cause the entire system to fail, such as shorting power and ground). After the processor 102 has determined that a drive has failed, it performs the RAID unction of data reconstruction by combining the data blocks from the remaining three data drives with the corresponding block from the parity drive to regenerate the failed drive's data. These are:

$dataA_{fourdrives}$=dataB⊕dataC⊕dataD⊕paritydata
$dataA_{threedrives}$=dataC⊕dataB⊕paritydata
$dataA_{twodrives}$=dataB⊕paritydata
$dataB_{fourdrives}$=dataA⊕dataC⊕dataD⊕paritydata
$dataB_{threedrives}$=dataA⊕dataC⊕paritydata
$dataB_{twodrives}$=dataA⊕paritydata
$dataC_{fourdrives}$=dataA⊕dataB⊕dataD⊕paritydata
$dataC_{threedrives}$=dataA⊕dataB⊕paritydata
$dataD_{fourdrives}$=dataA⊕dataB⊕dataC⊕paritydata This data reconstruction function is performed by processor 102. Data accesses suffer a slight performance degradation after a drive has failed.

Figure 2:
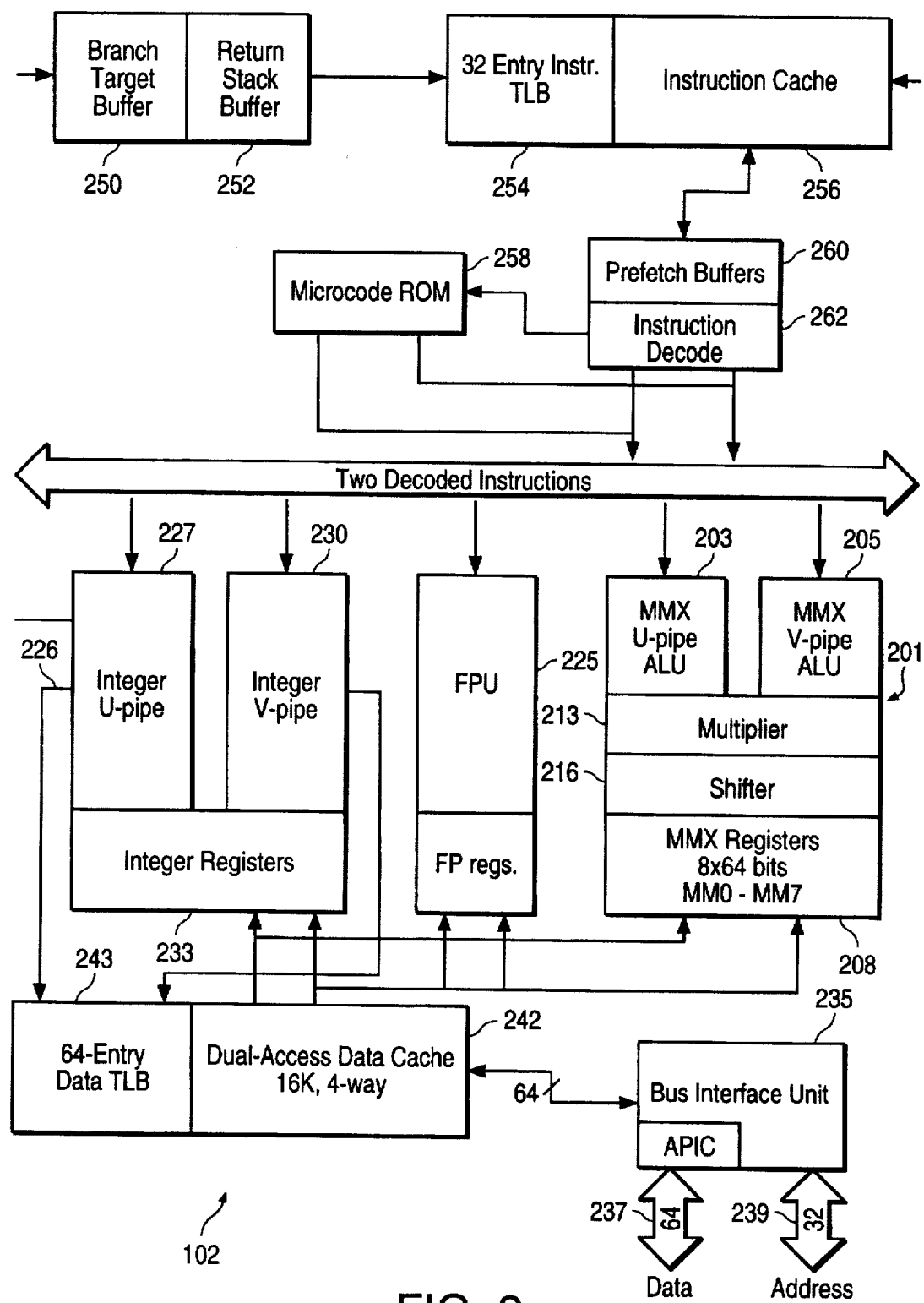
FIG. 2 shows a block diagram of a processor with a multimedia functional unit.

FIG. 2 shows the functional block diagram of a processor 102 with a multimedia functional unit. The processor is, for example, an Intel Corp. Pentium processor with a multimedia functional unit 201, referred to as the Intel P55C processor. The multimedia unit is capable of performing multimedia instructions such as PXOR. The multimedia unit and the multimedia instructions enhance the performance of computer programs for advanced media and communication applications such as video displays which require several individual byte and word operations.

Included in the multimedia unit 201 are two independent pipelines, the MMX U-pipe 203 and the MMX V-pipe 205. Multimedia instructions can be issued in pairs to the multimedia functional unit, and thus two multimedia instructions can be performed simultaneously. Included within the multimedia unit are eight 64-bit, multimedia MMX registers 208 (MM0–MM7). Also included is a multiplier 213 and shifter 216.

Included in the processor 102 are a floating point unit (FPU) 225, an integer unit 226 with two integer pipelines, integer U-pipe 227 and integer V-pipe 230, and integer registers 253. Also included in the processor are a bus interface unit 235 with 64-bit wide I/O data lines 237 and 32 bit wide I/O address lines 239. The processor further includes a 16 K, 4-way Dual-Access Data Cache 242 and a 64 bit Entry, Data Translation Lookaside Buffer (TLB) 243.

Also included in the processor are a Branch Target Buffer 250, a Return Stack Buffer 252, a 32 bit Entry Instruction TLB 254, an Instruction Cache 256, Prefetch Buffers 260, an Instruction Decode unit 262, and a Microcode ROM 258.

The P55C decodes up to two multimedia instructions per clock cycle. Thus, two 64-bit PXOR instructions can be executed per clock cycle. Alternatively, one multimedia instruction and an integer instruction can be executed in the same clock cycle.

The Intel PXOR instruction is the multimedia instruction that causes the multimedia functional unit to perform a bitwise logical XOR on the 64-bit destination register with a 64-bit source operand and write the result to the destination register.

Figure 3:
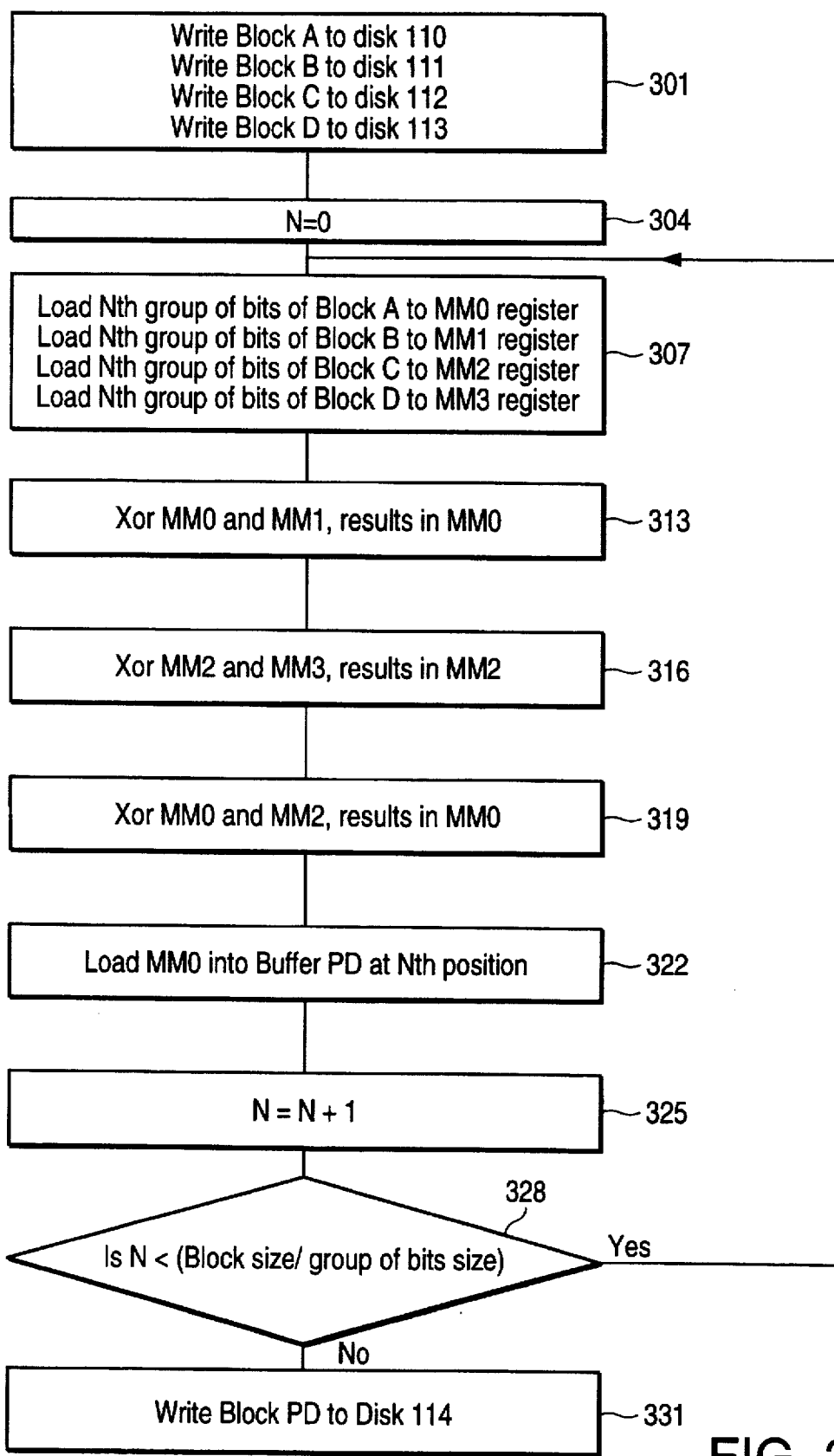
FIG. 3 shows a flow diagram of the computer system performing a RAID function of forming a parity block of data according to the present invention.

Other processors conforming to the X86 architecture and including multimedia extensions can also be used with the present invention. Those include the Pentium Pro Klamath processor, the AMD K6 processor, and the Cyrix M2 processor FIG. 3 shows a flow diagram for the RAID data striping function of forming a parity block of data using the multimedia functional unit of processor 102. For this example, the disk drive array consists of 5 disk drives. A group of data to be stored on the disk drive array 110–114 is initially stored in specific locations in the RAM memory 104 called buffers. A first 512 byte segment or block of data to be stored on the disk 110, block A, is located in Buffer A. The second 512 byte block of data to be stored in disk 111, block B, is located in Buffer B. The third 512 byte block of data to be stored in disk 112, block C, is located in Buffer C. The fourth 512 byte block of data to be stored in disk 113, block D, is located in Buffer D.

In step 301, block A in buffer A is loaded to disk drive 10, the block B in Buffer B is loaded to disk 111, block C in Buffer C is loaded to disk 112, and block D in Buffer D is loaded to disk 113.

During the first iteration through the flow chart in FIG. 3, in step 307, the first group of bits, more specifically 64 bits, of block A in buffer A is loaded into multimedia register MM0. The size of the first group of bits can vary depending the number of bits that may be XORed with a single XOR instruction or with the number of bits that may be stored in a register that can be operated on by an XOR instruction. The first group of 64 bits from block B in Buffer B is loaded into multimedia register MM1. The first group of 64 bits from block C in Buffer C is loaded into multimedia register MM2. The first group of 64 bits from block D in Buffer D is loaded into multimedia register MM3.

In step 313, registers MM0 and MM1 are XORed together by the multimedia functional unit 201 of the processor 102 performing an XOR instruction on register MM0 with register MM1, with the results of the XOR instruction, or the XORed bits, in register MM0. In step 316, registers MM2 and MM3 are XORed together by the multimedia functional unit 201 performing an XOR instruction on register 2 with register MM3, with the result in 2. In step 319, MM0 and MM2 are XORed together with the result in MM0.

In step 322, the contents of register MM0 are loaded into a first position in Buffer PD of the RAM memory 104 to form the first group of bits of block PD.

After incrementing the loop by one in step 325, a comparative step is performed in 328. If N is less than the block size/the group of bits size, then steps 307 through 325 are repeated. This ratio represents the percentage of block PD formed per iteration through the loop. In the preferred embodiment, the number of iterations through the loop for a block size of 512 bytes and a group size of 64 bits is equal to 64. The number of iterations will vary with the block size and the amount of bits that can be XORed in a single instruction. After all of the bits of each block have been XORed together to form the 512 byte block PD, block PD in buffer PD is loaded to disk drive 114 in step 331.

Several aspects of the flow diagram in FIG. 3 may be varied. For example, the writes from buffers A, B, C, and D, to disk drives 110, 111, 112, and 113, respectively may be performed after the PD buffer is loaded to disk 114 or in alternative, concurrently by the integer unit 226 of processor 102.

In other embodiments, the block size may be varied. For example, with the Novell Netware operating system architecture, blocks A, B, C, D, and PD would each be 4 Kbytes. Alternatively, the block size may be reduced so that the data is more dispersed among the disks. The determination of block size may also depend on hardware parameters of the individual computer systems.

In another embodiment, the number of bits that are XORed by the multimedia functional unit is varied depending upon the capabilities of the multimedia functional unit of the processor.

In other embodiments, the order of the steps can be changed while still obtaining the same parity block PD. In one alternative method, only the first group of bits from block A and block B are loaded into the multimedia registers in step 307. Afterwards they are XORed together as in step 313. Next the first group of bits from block C is loaded into MM1 and the XOR step 313 is repeated. The first group of bits from block D is loaded into MM1 and the XOR step 313 is repeated again. After the final XOR step 313, the result in register MM0 is the same result obtained as from the completion of step 319 in the embodiment shown on FIG. 3.

Figure 4:
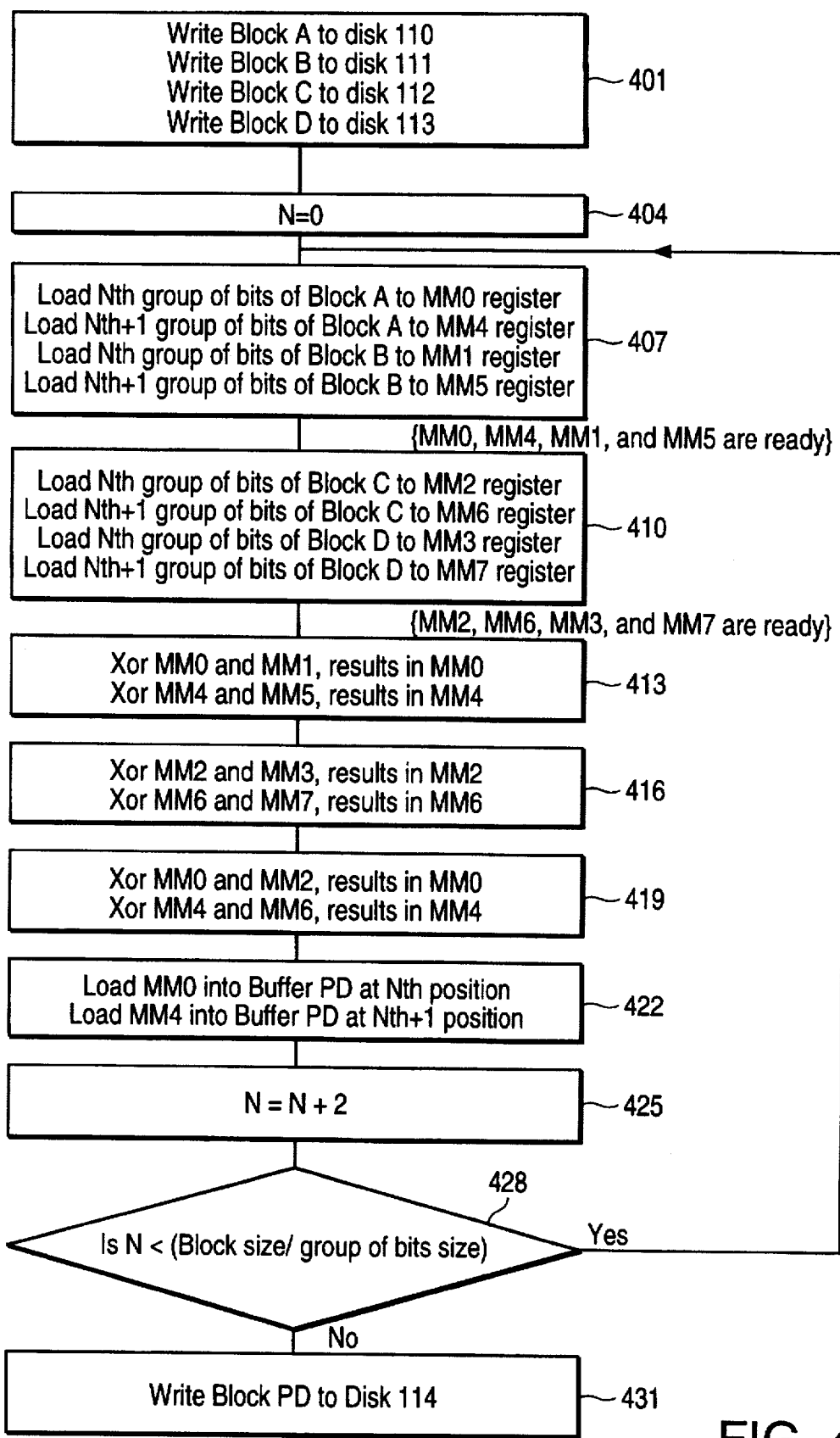
FIG. 4 shows a flow diagram of an alternative embodiment of the computer system performing a RID function of forming a parity block of data according to the present invention.

FIG. 4 shows a flow diagram for an alternative method of forming a parity block in a RAID data striping operation. The method shown is similar to FIG. 3 except that two MMX instructions can be performed at the same time with fewer pipeline stalls in the multimedia functional unit 201. Since more instructions can be performed per clock cycle, the time needed to perform the RAID functions is reduced.

Steps 401 and 404 are similar to that of 301 and 304. In step 407, the first group of 64 bits of block A from buffer A is loaded into multimedia register MM0. The second group of 64 bits from block A is loaded into multimedia register MM4. The first group of 64 bits of block B from Buffer B is loaded into multimedia register MM1. The next group of 64 bits of block B from Buffer B is loaded into Multimedia register MM5. Since the reservation stations (not shown in FIG. 2) of processor 102 see that multimedia registers MM0, MM4, MM1, and MM5 are ready to be dispatched, those registers are ready for XORing.

In step 410, the first group of 64 bits of block C in Buffer C is loaded into multimedia register MM2. The second group of 64 bits of block C in is loaded into multimedia register MM6. The first group of 64 bits of block D in Buffer D is loaded into multimedia register MM3. The next group of 64 bits of block D is loaded into multimedia register MM7. At this time, multimedia registers MM2, MM6, MM3, and MM7 are ready for XORing.

In step 413, registers MM0 and MM1 are XORed together by the multimedia functional unit 201 of the processor 102 performing an XOR instruction on register MM0 with register MM1, with the results of the XOR instruction, or the XORed bits, in register MM0. MM2 and MM3 are XORed by the multimedia functional unit 201 performing an XOR instruction on register MM2 with register MM3, with the results of the XOR instruction in MM2. In one embodiment, the two XOR instructions can be performed by the multimedia functional unit 201 during the same clock cycle.

In step 416, MM2 and MM3 are XORed together with the result in MM2. MM6 and MM7 are XORed together with the result in MM6.

In step 419, MM0 and MM2 are XORed together with the result in MM0. MM4 and MM6 are XORed together with the result in MM4.

In step 422, the contents of register MM0, which form the first group of bits for the PD block, are loaded into a first position in Buffer PD of the RAM memory 104, and the contents of MM4, which form the second group of bits for the PD block, are loaded to a second position of buffer PD.

After incrementing the loop by two in step 425, a comparative step is performed in 428. If N is less than the block size/the group of bits size, then steps 407 through 425 are repeated. This ratio represents one half of the percentage of block PD formed per iteration through the loop. In the preferred embodiment, the number of iterations through the loop for a block size of 512 bytes and a group size of 64 bits is equal to 32. After all of the bits of each block are XORed together to form the 512 byte block PD, the PD block in buffer PD is loaded to disk drive 114 in step 431.

Loading two groups of 64 bits from each buffer into the multimedia registers enables the XORing instructions and/or other instructions essential to perform the RAID function to be paired and performed by the multimedia functional unit during the same clock cycle thus minimizing pairing violations and pipeline stalls. More data is ready to be fed to the U-pipeline 203 and V-pipeline 205 of processor 102 because data dependencies are reduced.

Figure 5:
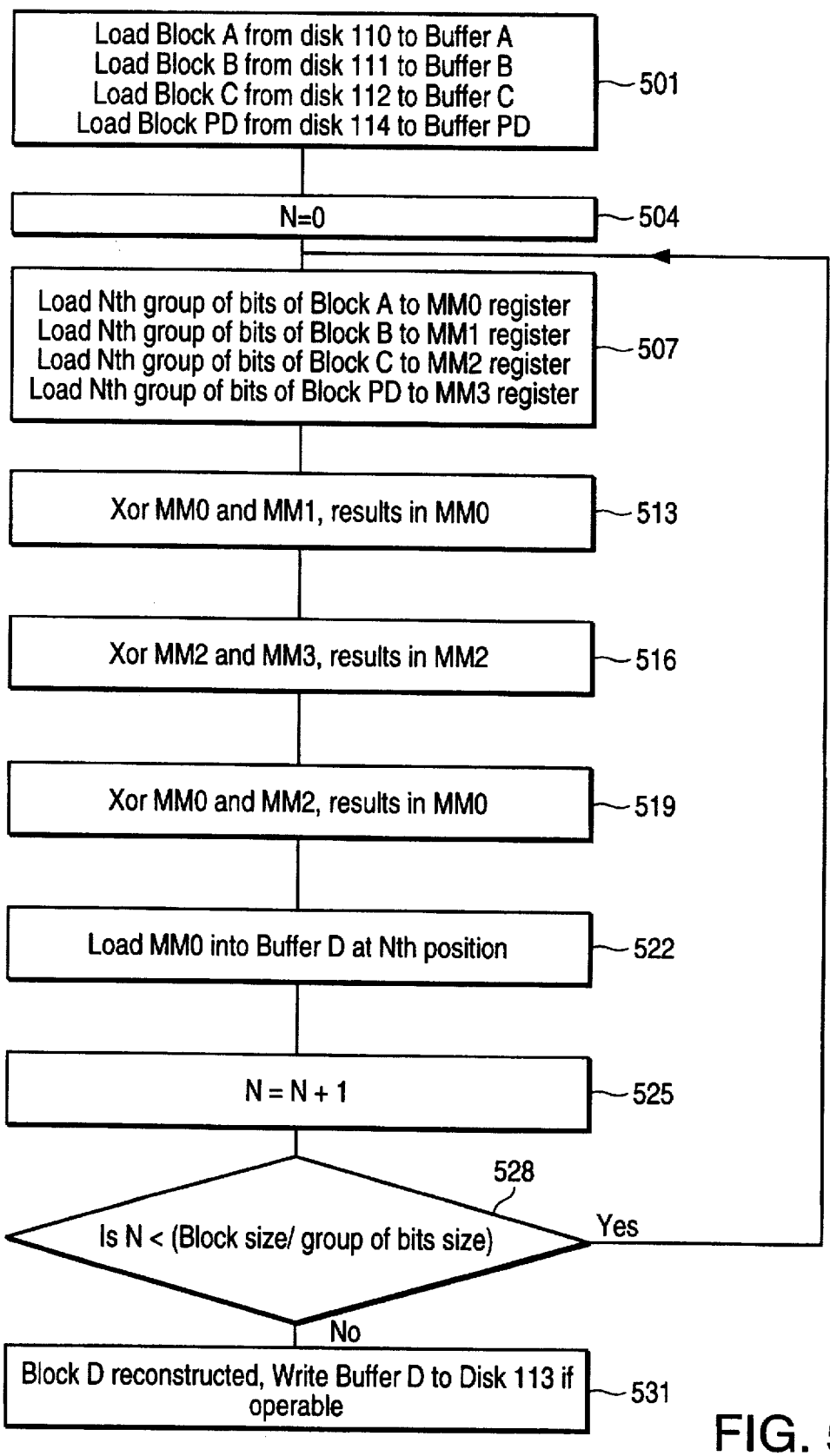
FIG. 5 shows a flow diagram of the computer system performing a RAID function of data reconstruction according to the present invention.

FIG. 5 shows a flow diagram for the RAID function of data reconstruction using the multimedia functional unit of processor 102. If one of the disk drives becomes inoperable, the data from that drive could be reconstructed by XORing the data from the other disks.

In FIG. 5, drive 113, which stores data block D, becomes inoperable. The processor 102 recognizes that the data in drive 113 is inaccessible and initiates the RAID function of data reconstruction. In step 501, block A stored in disk drive L10 is loaded to Buffer A. Block B stored in disk drive 111 is loaded to Buffer B. Block C stored in disk drive 112 is loaded to Buffer C. Block PD, the parity block, stored in disk drive 114 is loaded into Buffer PD.

Steps 504 through 528 in FIG. 5 are similar to steps 304 through 328 in FIG. 3. During the first iteration through the flow chart in FIG. 5, in step 507, the first group of 64 bits of block A in buffer A is loaded into multimedia register MM0. The first group of 64 bits from block B in Buffer B is loaded into multimedia register MM1. The first group of 64 bits from block C in Buffer C is loaded into multimedia register MM2. The first group of 64 bits from block PD in Buffer PD is loaded into multimedia register MM3.

In step 513, registers MM0 and MM1 are XORed together by the multimedia functional unit 201 of the processor 102 performing an XOR instruction on register MM0 with register MM1, with the results of the XOR instruction, or the XORed bits, in register MM0. In step 516, registers MM2 and MM3 are XORed together by the multimedia functional unit 201 performing an XOR instruction on register MM2 with register MM3, with the result in MM2. In step 519, MM0 and MM2 are XORed together with the result in MM0.

In step 522, the contents of register MM0 are loaded into a first position in Buffer D of the RAM memory 104 to form the first group of bits of the reconstructed block D.

After incrementing the loop by one in step 525, a comparative step is performed in 528. If N is less than the block size/the group of bits size, then steps 507 through 525 are repeated. This ratio represents the percentage of reconstructed block D formed per iteration through the loop. In the preferred embodiment, the number of iterations through the loop for a block size of 512 bytes and a group size of 64 bits is equal to 64. After all of the bits of each block have been XORed together to form the 512 byte reconstructed block D, block D in buffer D is loaded to a repaired or replaced disk drive 114 in step 531.

Figure 6:
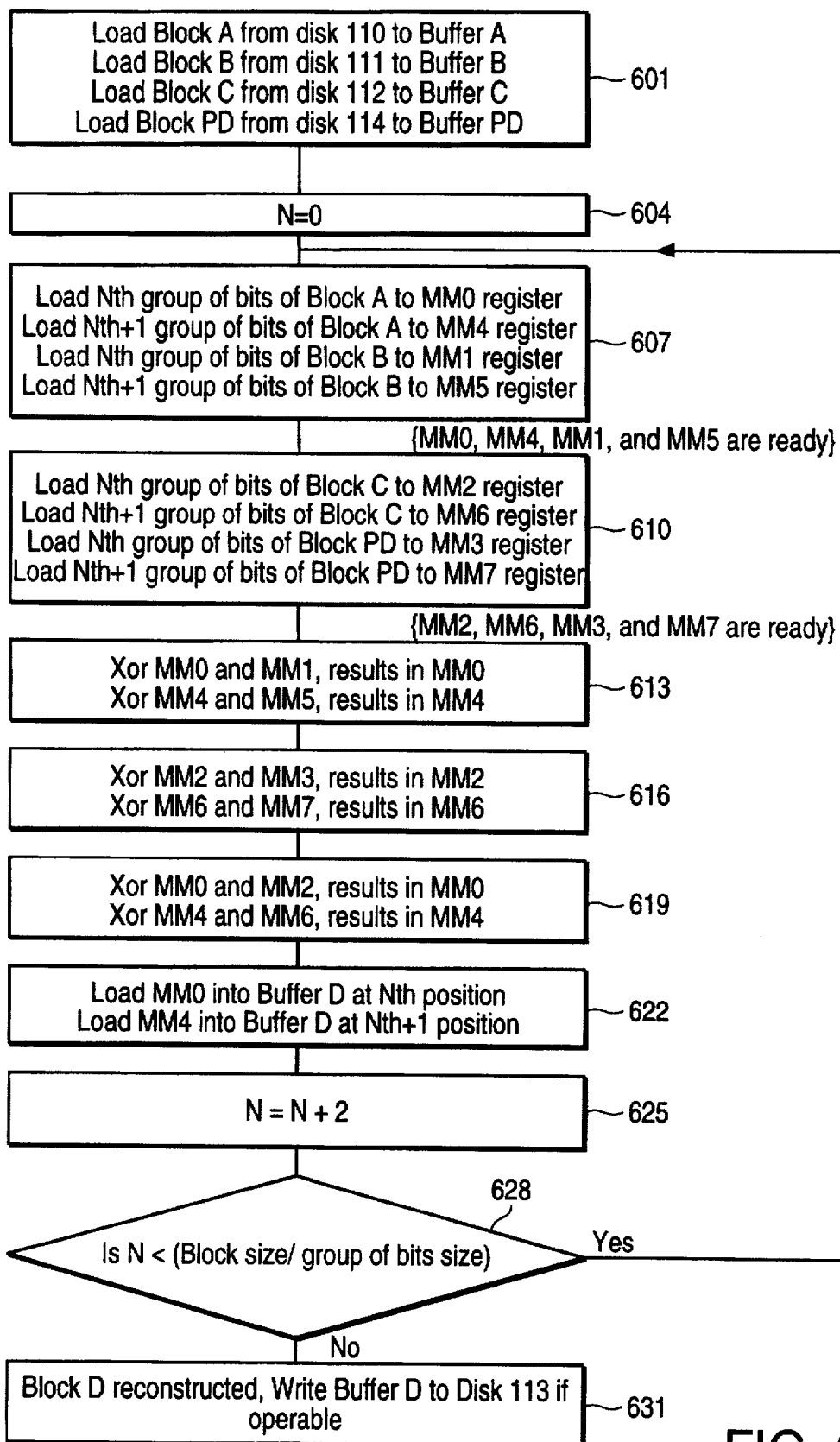
FIG. 6 shows a flow diagram of an alternative embodiment of the computer system performing a RAID function of data reconstruction according to the present invention.

FIG. 6 shows a flow diagram for an alternative method of performing the RAID function of data reconstruction. The method shown is similar to FIG. 5 except that two MMX instructions can be performed at the same time with fewer pipeline stalls in the multimedia functional unit 201. Since more instructions can be performed per clock cycle, the time needed to perform the RAID functions is reduced.

Step 601 is similar to step 501 of FIG. 5. Steps 604 through 628 are similar to steps 404 through 428 in FIG. 4. In step 607, the first group of 64 bits of block A from buffer A is loaded into multimedia register MM0. The second group of 64 bits from block A is loaded into multimedia register MM4. The first group of 64 bits of block B from Buffer B is loaded into multimedia register MM1. The next group of 64 bits of block B from Buffer B is loaded into Multimedia register MM5. Since the reservation stations (not shown in FIG. 2) of processor 102 see that multimedia registers MM0, MM4, MM1, and MM5 are ready to be dispatched, those registers are ready for XORing.

In step 610, the first group of 64 bits of block C in Buffer C is loaded into multimedia register 2. The second group of 64 bits of block C in is loaded into multimedia register MM6. The first group of 64 bits of block PD in Buffer PD is loaded into multimedia register MM3. The next group of 64 bits of block PD is loaded into multimedia register MM7. At this time, multimedia registers MM2, MM6, MM3, and MM7 are ready for XORing.

In step 613, registers MM0 and MM1 are XORed together by the multimedia functional unit 201 of the processor 102 performing an XOR instruction on register MM0 with register MM1, with the results of the XOR instruction, or the XORed bits, in register MM0. MM2 and MM3 are XORed by the multimedia functional unit 201 performing an XOR instruction on register MM2 with register MM3, with the results of the XOR instruction in MM2. In one embodiment, the two XOR instructions can be performed by the multimedia functional unit 201 during the same clock cycle.

In step 616, MM2 and MM3 are XORed together with the result in MM2. MM6 and MM7 are XORed together with the result in MM6.

In step 619, MM0 and MM2 are XORed together with the result in MM0. MM4 and MM6 are XORed together with the result in MM4.

In step 622, the contents of register MM0, which form the first group of bits for the reconstructed block D, are loaded into a first position in Buffer D of the RAM memory 104, and the contents of MM4, which form the second group of bits for the reconstructed block D, are loaded to a second position of buffer D.

After incrementing the loop by two in step 625, a comparative step is performed in 628. If N is less than the block size/the group of bits size, then steps 607 through 625 are repeated. This ratio represents one half of the percentage of reconstructed block ID formed per iteration through the loop. In the preferred embodiment, the number of iterations through the loop for a block size of 512 bytes and a group size of 64 bits is equal to 32. After all of the bits of each block are XORed together to form the 512 byte reconstructed block D, block D in buffer D is loaded to a repaired or replaced disk drive 114 in step 631.

As with FIG. 4, loading two groups of 64 bits from each buffer into the multimedia registers enables the XORing instructions and/or other instructions essential to perform the RAID function to be paired and performed by the multimedia functional unit during the same clock cycle thus minimizing pairing violations and pipeline stalls. More data is ready to be fed to the U-pipeline 203 and V-pipeline 205 of processor 102 because data dependencies are reduced.

The RAID functions described could also be performed, with some modifications, by using other types of XOR instructions, such as the exclusive NOR (XNOR) instruction or some combination of AND and OR instructions.

The present invention can be modified to be run on a multi-processor computer system where at least one of the processors has a multimedia functional unit.

While particular embodiments of the present invention have been shown and described, it will be obvious to those skilled in the art that changes and modifications may be made without departing from this invention and it's broader aspects and, therefore, the appending claims are to encompass within their scope all such changes and modifications as all within the true spirit and scope of this invention.

What is claimed is:

1. A method for storing and recovering bits on an array of disk drives comprising:

providing a processor with a multimedia functional unit capable of executing an Exclusive OR(XOR) type instruction;

performing an XOR type instruction in the multimedia functional unit of the processor on the first group of bits originating from a memory with a second group of bits to obtain a first group of XORed bits in order to perform a redundant array of inexpensive disks (RAID) function.

2. The method of claim 1 further comprising:

loading the first group of bits from the memory to a first disk drive of the array.

3. The method of claim 1 wherein the second group of bits originate from the memory.

4. The method of claim 3 further comprising:

performing an XOR type instruction in the multimedia functional unit on the first group of XORed bits with a third group of bits to obtain a second group of XORed bits.

5. The method of claim 4 further comprising:

loading the second group of XORed bits to a first disk drive of the array.

6. The method of claim 4 wherein the third group of bits originate from the memory.

7. The method of claim 6 further comprising:

performing an XOR type instruction in the multimedia functional unit on the second group of XORed bits with a fourth group of bits originating from a memory to obtain a third group of XORed bits.

8. The method of claim 7 further comprising:

loading the third group of XORed bits to a first disk drive of the array.

9. The method of claim 4 further comprising:

performing an XOR type instruction in the multimedia functional unit of a processor on a fourth group of bits originating from the memory with a fifth group of bits to obtain the third group bits.

10. The method of claim 9 wherein the fifth group of bits originate from a memory.

11. The method of claim 10 further comprising:

loading the second group of XORed bits to a first disk drive of the array;

loading the first group of bits to a second disk drive of the array;

loading the second group of bits to a third disk drive of the array;

loading the fourth group of bits to a fourth disk drive of the array;

loading the fifth group of bits to a fifth disk drive of the array.

12. The method of claim 2 further comprising:

loading the first group of XORed bits to a second disk drive of the array.

13. The method of claim 2 further comprising:

loading the second group of bits to a third disk drive of the array.

14. The method of claim 1 further comprising:

performing a processor instruction in an integer unit of the processor during a clock cycle, the performing an XOR type instruction in the multimedia functional unit occurring in same clock cycle.

15. The method of claim 1 further comprising:

performing a second instruction in the multimedia functional unit of the processor during a clock cycle in order to perform a RAID function, the performing of the XOR type instruction in the multimedia unit occurring during the same clock cycle.

16. The method of claim 15 where the second instruction is an XOR type instruction.

17. The method of claim 1 where the first group of bits and the second group of bits each consist of 64 bits.

18. The method of claim 1 further comprising:

loading the first group of bits from a memory into a first register, wherein the processor performs the XOR type instruction on the first group of bits in the first register.

19. The method of claim 18 wherein the second group of bits are in a second register when the processor performs the XOR type instruction on the second group of bits.

20. The method of claim 1 further comprising:

recognizing by the processor that a first disk drive of the array is inoperable:

loading the first group of bits from a second disk drive of the array into the memory;

loading the second group of bits from a third disk drive of the array into the memory.

21. The method of claim 1 wherein the XOR type instruction is an XOR instruction.

22. A computer system comprising:

a processor including a multimedia functional unit;

a memory coupled to the processor, the memory storing a plurality of blocks of data, each block including at least one group of bits;

an array of disk drives coupled to the processor, the processor sending and receiving data to and from each disk drive, each disk drive receiving and storing at least one block of data from the memory, a non-volatile memory coupled to the processor, the non-volatile memory including:

means for forming a first block of data using the multimedia functional unit to perform an exclusive OR (XOR) type instruction on at least one group of bits from a second block of data with at least one group of bits from a third block of data; and means for storing the first block of data on a first disk drive of the array, the second block of data on a second disk drive of the array, and the third block of data on a third disk drive of the array.

23. The computer system of claim 22 where the processor is a processor compatible with an X86 architecture.

24. The computer system of claim 22 further comprising:

a drive controller, for sending and receiving data from the processor to each of the plurality of disk drives of the array.

25. The computer system of claim 22 further comprising:

an operating system for controlling the operation of the computer system, the operating system conforming substantially to a Windows NT architecture.

26. The computer system of claim 22 wherein:

the means for forming the first block of data further includes means for forming a first group of bits of the first block of data using the multimedia functional unit to perform an XOR type instruction on a group of bits from the second block of data, on a group bits from the third block of data, on a group of bits from a fourth block of data, and a group of bits from a fifth block of data;

the means for storing further includes means for storing the fourth block of data on a fourth disk drive of the array and the fifth block of data on the fifth disk drive of the array.

27. The computer system of claim 22 wherein:

the processor further includes an integer unit, the processor capable of performing an integer instruction using the integer unit during the same clock cycle as the multimedia functional unit performs the XOR type instruction.

28. The computer system of claim 22 wherein:

the multimedia functional unit is capable of performing two instructions in a single clock cycle;

the means for forming the first block of data further includes means for using the multimedia functional unit to perform a second instruction in the same clock cycle as the XOR type function.

29. The computer system of claim 28 where the second instruction is an XOR type instruction on a second group of bits from the second block with a second group of bits from the third block.

30. The computer system of claim 22 wherein the non-volatile memory further includes means for reconstructing the second block of data using the multimedia functional unit to perform an XOR type instruction on at least one group of bits from the first block of data with at least one group of bits from the third block of data.

31. The computer system of claim 22 wherein the array of disk drives is an array of hard disk drives.

32. The computer system of claim 22 further comprising:

an operating system for controlling the operation of the computer system, the operating system conforming substantially to a Netware architecture.

* * * * *